(12) United States Patent
Nomura et al.

(10) Patent No.: US 9,572,255 B2
(45) Date of Patent: Feb. 14, 2017

(54) ELECTRONIC DEVICE, BONDING MATERIAL, AND METHOD FOR PRODUCING ELECTRONIC DEVICE

(71) Applicant: MURATA MANUFACTURING CO., LTD., Nagaokakyo-Shi, Kyoto-Fu (JP)

(72) Inventors: Akihiro Nomura, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 97 days.

(21) Appl. No.: 14/224,250

(22) Filed: Mar. 25, 2014

(65) Prior Publication Data

US 2014/0218886 A1   Aug. 7, 2014

Related U.S. Application Data

(63) Continuation of application No. PCT/JP2012/072699, filed on Sep. 6, 2012.

(30) Foreign Application Priority Data

Sep. 30, 2011   (JP) ................................ 2011-216928

(51) Int. Cl.
   *B23K 35/22*   (2006.01)
   *H05K 1/11*   (2006.01)
   (Continued)

(52) U.S. Cl.
   CPC ............ *H05K 1/111* (2013.01); *B23K 35/262* (2013.01); *B23K 35/362* (2013.01);
   (Continued)

(58) Field of Classification Search
   None
   See application file for complete search history.

(56) References Cited

U.S. PATENT DOCUMENTS 6,656,291 B1 * 12/2003 Ueda .................... B23K 35/025
                                                              148/24
2006/0043597 A1   3/2006 Wada et al.
(Continued)

FOREIGN PATENT DOCUMENTS

JP   2006-150413 A   6/2006
JP   2008-012576 A   1/2008
(Continued)

OTHER PUBLICATIONS

PCT/JP2012/072699 Written Opinion dated Nov. 8, 2012.
PCT/JP2012/072699 ISR dated Nov. 8, 2012.

*Primary Examiner* — Jessee Roe
*Assistant Examiner* — Ngoclan T Mai
(74) *Attorney, Agent, or Firm* — Arent Fox LLP

(57) ABSTRACT

An electronic device has a printed substrate having land electrodes and a chip-type electronic component having external electrodes formed on a surface of a component element body. The land electrodes and the external electrodes are bonded via a solder to form electrode bonding parts. A thermosetting resin is filed between the electrode bonding parts. The bonding material contains solder particles having a melting point T1, a thermosetting resin having a curing temperature T2 that is higher than the melting point T1, and an activating agent having an activation temperature T3 that is lower than the curing temperature T2. The viscosity of the contained components except the solder particles at the melting point T1 is 0.57 Pa·s or less, and the melting point T1 and the activation temperature T3 satisfy T1−T3<50° C.

20 Claims, 4 Drawing Sheets

(51) Int. Cl.
*H05K 3/34* (2006.01)
*B23K 35/26* (2006.01)
*B23K 35/36* (2006.01)
*B23K 35/362* (2006.01)
*H05K 13/04* (2006.01)

(52) U.S. Cl.
CPC ....... *B23K 35/3613* (2013.01); *H05K 3/3442* (2013.01); *H05K 13/0465* (2013.01); *H05K 3/3484* (2013.01); *H05K 2201/0212* (2013.01); *H05K 2201/0305* (2013.01); *H05K 2201/10977* (2013.01); *H05K 2203/0425* (2013.01); *Y02P 70/613* (2015.11)

(56) References Cited

U.S. PATENT DOCUMENTS

| | | | |
|---|---|---|---|
| 2010/0147567 A1* | 6/2010 | Hino | C08K 5/09 |
| | | | 174/257 |
| 2010/0327044 A1 | 12/2010 | Sakai et al. | |

FOREIGN PATENT DOCUMENTS

| | | |
|---|---|---|
| JP | 2008-510620 A | 4/2008 |
| JP | 2008-293820 A | 12/2008 |
| JP | 2008-302407 A | 12/2008 |
| JP | 2010-034504 A | 2/2010 |
| JP | 2010-144150 A | 7/2010 |
| JP | 2010-235823 A | 10/2010 |
| JP | 2010-285580 A | 12/2010 |
| JP | 2011-165954 A | 8/2011 |
| JP | 2011-181467 A | 9/2011 |
| TW | 200937452 A | 9/2009 |
| WO | WO-2009-107342 A1 | 9/2009 |

* cited by examiner

ELECTRONIC DEVICE, BONDING MATERIAL, AND METHOD FOR PRODUCING ELECTRONIC DEVICE

CROSS REFERENCE TO RELATED APPLICATIONS

The present application is a continuation of International application No. PCT/JP2012/072699, filed Sep. 6, 2012, which claims priority to Japanese Patent Application No. 2011-216928, filed Sep. 30, 2011, the entire contents of each of which are incorporated herein by reference.

FIELD OF THE INVENTION

The present invention relates to an electronic device, a bonding material, and a method for producing an electronic device. More particularly, the present invention relates to an electronic device in which a plurality of electronic components each having two or more electrodes are bonded via a metal such as a solder, a bonding material suitable for bonding the electrodes of these plural electronic components with each other, and a method for producing an electronic device using this bonding material.

BACKGROUND OF THE INVENTION

A soldering method is widely used as a technique for bonding the electrodes of different electronic components with each other, such as surface mounting of a chip-type electronic component onto a substrate.

Further, as a bonding material, a solder paste containing a solder, a thermosetting resin, an activating agent, and others is known from the past.

For example, Patent Document 1 proposes a solder paste containing solder particles made of a tin-bismuth-based solder, a thermosetting resin that is cured at a temperature higher than the melting point of the solder, and an activating agent that is activated by the heat at the time of soldering to remove an oxide film on the surface of the solder, wherein the activating agent is activated at a temperature equal to or higher than the melting point of the solder.

FIG. 4 is a cross-sectional view for describing the soldering method disclosed in Patent Document 1, where a chip-type electronic component 101 is surface-mounted on a printed substrate 102. In other words, in this chip-type electronic component 101, external electrodes 104a, 104b are formed on the two sides of a component element body 103. On the other hand, in the printed substrate 102, a pair of land electrodes 105a, 105b is formed on the surface to correspond to the external electrodes 104a, 104b, respectively. Further, a solder paste containing a solder, a thermosetting resin, and an activating agent is used as a bonding material, whereby the land electrodes 105a, 105b and the external electrodes 104a, 104b are bonded via solders 106a, 106b, respectively.

In other words, if the thermosetting resin starts to be cured before the solder particles are melted, the melted solder cannot flow to move sufficiently in the thermosetting resin. As a result of this, the solder particles may not be bonded with each other or the solder may not be bonded to the electrodes, thereby raising a fear of deteriorating the electrical connection property of the electronic components with each other. Furthermore, the activating agent must be melted to be brought into contact with the surface of the solder particles before the thermosetting resin is cured to lose its fluidity.

Therefore, in Patent Document 1, by using a solder paste in which the curing temperature of the thermosetting resin is higher than the melting point of the solder particles or the activation temperature of the activating agent, the solder 106a, 106b being melted is allowed to flow and move sufficiently in a thermosetting resin 107a, 107b, and the activating agent is brought into contact with the solder particles, whereby the activating agent and the solder particles undergo an oxidation-reduction reaction on the surface of the solder particles thereby to remove an oxide layer that is present on the surface of the solder particles.

Also, in Patent Document 1, the activation temperature of the activating agent is made to be equal to or higher than the melting point of the solder particles, thereby to delay the curing action of the thermosetting resin 107a, 107b. In other words, by raising the activation temperature of the activating agent which acts also as a curing agent of the thermosetting resin 107a, 107b, the curing action of the thermosetting resin 107a, 107b is delayed, thereby to prevent the fluidity of the solder 106a, 106b being melted from being hindered by the thermosetting resin 107a, 107b, so as to prevent decrease in the self-alignment.

Patent Document 1: Japanese Patent Application Laid-open (JP-A) No. 2006-150413 (Claim 1, paragraphs [0013], [0031], FIG. 1, and others)

SUMMARY OF THE INVENTION

However, in Patent Document 1, though it is attempted to ensure the fluidity of the solder 106a, 106b by setting the curing temperature of the thermosetting resin 107a, 107b to be higher than the activation temperature of the activating agent and the melting point of the solder 106a, 106b, it is difficult to allow the solder 106a, 106b being melted to flow and move sufficiently in the thermosetting resin 107a, 107b when the viscosity of the thermosetting resin 107a, 107b is high. In other words, when the viscosity of the thermosetting resin 107a, 107b is high and the thermosetting resin 107a, 107b does not have a sufficient fluidity, the fluidity of the solder in the resin is also inferior, so that it is not possible to ensure the bonding property of the solder particles with each other or the bonding property of the solder particles to the external electrodes 104a, 104b and/or the land electrodes 105a, 105b sufficiently, thereby raising a fear of deteriorating the reliability of the electrical connection property.

Also, in Patent Document 1, a void gap 108 is formed in a part surrounded by the substrate 102, the lower surface of the component element body 103, and the thermosetting resin 107a, 107b, thereby raising a fear of being inferior in the mechanical strength, the electrical connection property, and the like.

When the void gap 108 such as described above is present, distortion is liable to be generated in the printed substrate 102 due to the difference in thermal expansion coefficient of the chip-type electronic component 101, the substrate 102, and others when a predetermined heat cycle is imposed at the time of use. Further, when such a distortion repetitively occurs, there is a fear of generating exfoliation or structural defects such as cracks in the inside of the solder 106a, 106b or between the solder 106a, 106a and the external electrodes 104a, 104b and/or the land electrodes 105a, 105b, thereby raising a fear of making it impossible to ensure a sufficient mechanical strength and deteriorating the reliability of the electrical connection property.

Also, when the electronic device is exposed to high-temperature and high-humidity conditions for a long period of time, the neighborhood of the solder 106a, 106b may absorb moisture, thereby raising a fear of inviting deterioration in the insulation property and the like and inviting decrease in the reliability.

The present invention has been made in view of the aforementioned circumstances, and an object thereof is to provide an electronic device having a good mechanical strength, a good electrical connection property, and good insulation reliability, a bonding material suitable for fabrication of this electronic device, and a method for producing an electronic device using this bonding material.

In order to achieve the aforementioned object, the electronic device according to the present invention is an electronic device having a plurality of electronic components in each of which two or more electrodes are formed, wherein one electronic component and another electronic component among the plurality of electronic components are electrically connected, in which electrodes of the one electronic component and electrodes of the other electronic component are bonded via a metal to form two or more electrode bonding parts that are electrically insulated from each other, and a gap between one of the electrode bonding parts and another of the electrode bonding parts is filled with a thermosetting resin.

This can prevent a void gap from being present between the electrode bonding parts, whereby the mechanical strength of the electronic device is improved. Also, even when a predetermined heat cycle is imposed as a load at the time of use, it is possible to suppress generation of a distortion or the like in the electronic components, and also, even when the distortion or the like is repetitively generated, deterioration of the electrical connection can be suppressed.

Also, in the electronic device of the present invention, the metal preferably contains a Sn—Bi-based alloy as a major component.

In this case, since the thermal expansion coefficient of the Sn—Bi-based alloy is small, the distortion generated in the electronic components can be reduced even when a predetermined heat cycle is imposed as a load at the time of use. Also, since Young's modulus of the Sn—Bi-based alloy is small, generation of structural defects such as cracks between the electrode bonding parts can be particularly suppressed even when a distortion is generated in the electronic components.

Also, in the electronic device of the present invention, it is preferable that the plurality of electronic components include a substrate in which land electrodes are formed and a chip-type component in which external electrodes are formed on a surface of a component element body, and the land electrodes and the external electrodes are bonded via the metal to form the electrode bonding parts.

This can prevent a void gap from being present between the electrode bonding parts and can suppress distortion generation of the substrate caused by the difference in thermal expansion coefficient between the chip-type component and the substrate, or the like. Therefore, an electronic device having a good mechanical strength, a good electrical connection property, and good insulation reliability can be obtained.

Also, in fabricating an electronic device described above, a bonding material containing metal particles, a thermosetting resin, and an activating agent as described in Patent Document 1 is widely used. In this case, it is desirable that the curing temperature of the thermosetting resin is higher than the melting point of the metal particles and the activation temperature of the activating agent.

Under such premises, the present inventors and others have made eager researches and have obtained the following knowledge. That is, when a bonding material is prepared in such a manner that the viscosity of contained components except the metal particles at the melting point of the metal particles is restrained to be 0.57 Pa·s or less and that the activation temperature of the activating agent, even when being lower than the melting point of the metal particles, is not lower by more than 50° C. than the melting point, then the thermosetting resin can be let to flow and move well without deteriorating the activation function (reduction function) of the activating agent, whereby a desired electronic device described above can be obtained.

In other words, the bonding material according to the present invention at least contains metal particles that are melted at a first temperature T1, a thermosetting resin that is cured at a second temperature T2 that is higher than the first temperature T1, and an activating agent that is activated at a third temperature T3 that is lower than the second temperature T2 so as to remove an oxide layer formed on a surface of the metal particles, in which a viscosity of contained components except the metal particles at the first temperature T1 is 0.57 Pa·s or less, and the first temperature T1 and the third temperature T3 satisfy T1−T3<50° C.

This allows that the metal particles and the activating agent flow and move sufficiently before the thermosetting resin is cured and, when the thermosetting resin is cured, the melted metal particles are firmly bonded to the electrodes and other metal particles that flow and move in the thermosetting resin without intervention of an oxide layer. Also, since the fluidity of the thermosetting resin is good, the thermosetting resin can be let to flow and move into the gap formed between the electrode bonding parts to fill the gap by simply applying the bonding material onto the electrodes of one electronic component, thereby contributing to an improvement in the mechanical strength of the electronic device. Further, even when the bonding material is applied onto a surface including the electrodes of one electronic component, the metal particles move towards the electrode side by combination of the fluidizing function of the thermosetting resin, the activation function of the activating agent, and the wetting function of the metal particles to the electrodes. Therefore, in the electrode bonding parts, the metal particles are firmly bonded with each other, and also the metal particles are firmly bonded to the electrodes. On the other hand, between the electrode bonding parts, only the thermosetting resin remains, thereby contributing to an improvement in the mechanical strength and an improvement in the insulation reliability of the electronic device.

Also, the bonding material of the present invention is preferably such that the metal particles contain a Sn—Bi-based alloy as a major component.

Further, the bonding material of the present invention is preferably such that the content of the metal particles is 50 vol % or less in volume ratio.

This allows that an electronic device having a good mechanical strength can be obtained without deteriorating the printing properties.

Also, the bonding material of the present invention is preferably such that the content of the metal particles is 10 vol % or more in volume ratio.

This allows that an electronic device having a good mechanical strength can be obtained without deteriorating the electrical properties.

Further, the bonding material of the present invention is preferably such that the content of the metal particles is 15 vol % or more in volume ratio.

This allows that, even when the bonding material is applied onto a surface including the electrodes of one electronic component, the metal particles can be let to flow and move efficiently to the electrode bonding parts.

Also, the method for producing an electronic device according to the present invention is a method for producing an electronic device having a plurality of electronic components in each of which two or more electrodes are formed, wherein one electronic component and another electronic component among the plurality of electronic components are electrically connected, the method comprising the steps of applying the bonding material described in any one of the above onto the electrodes of the one electronic component and thereafter disposing the electrodes of the other electronic component onto the bonding material, and performing a heating treatment to melt the metal particles contained in the bonding material and to activate the activating agent contained in the bonding material to remove an oxide layer formed on the surface of the metal particles, so as to bond the electrodes of the one electronic component and the electrodes of the other electronic component via the melted metal to form two or more electrode bonding parts that are electrically insulated from each other and, in the meantime, to fluidize the thermosetting resin contained in the bonding material so as to fill a gap formed between the electrode bonding parts with the thermosetting resin.

This suppresses the structural defects such as exfoliation or cracks in the inside of the metal or between the metal and the electrode, whereby an electronic device with improved mechanical strength, electrical connection property, and insulation reliability can be obtained.

Further, the method for producing an electronic device according to the present invention is a method for producing an electronic device having a plurality of electronic components each of which has two or more electrodes, wherein one electronic component and another electronic component are electrically connected, the method comprising the steps of applying the bonding material described in any one of the above onto a surface including the electrodes of the one electronic component and thereafter disposing the other electronic component onto the bonding material, and performing a heating treatment to melt the metal particles contained in the bonding material and to activate the activating agent contained in the bonding material to remove an oxide layer formed on the surface of the metal particles, so as to let the melted metal particles move to a site between the electrodes of the one electronic component and the electrodes of the other electronic component to bond between the electrodes so as to form two or more electrode bonding parts that are electrically insulated from each other and to fill between the electrode bonding parts with the thermosetting resin contained in the bonding material.

This allows that an electronic device having a good electrical connection property and a good insulation property can be obtained without generating a short circuit or the like.

According to the above-described electronic device, the electrodes of one electronic component and the electrodes of another electronic component are bonded via a metal such as a Sn—Bi-based alloy to form two or more electrode bonding parts that are electrically insulated from each other, and the gap between one of the electrode bonding parts and another of the electrode bonding parts is filled with the thermosetting resin, so that a void gap can be prevented from being present between the electrode bonding parts. Therefore, the mechanical strength of the electronic device is improved. Also, even when a predetermined heat cycle is imposed as a load at the time of use, it is possible to suppress generation of a distortion or the like in the electronic components, and also, even when the distortion or the like is repetitively generated, deterioration of the electrical connection can be suppressed. In other words, the mechanical strength between the electrode bonding parts is improved, so that it is possible to suppress exfoliation in the inside of the metal or between the electronic components and the metal and generation of structural defects such as cracks. Further, the bonding state in the inside of the metal and the bonding state between the metal and the electrodes are made firm, so that the reliability of the electrical connection property is improved. Also, as described above, since the gap between the electrode bonding parts is filled with the thermosetting resin, the electrode bonding parts can be prevented as much as possible from absorbing moisture even when the electronic device is left to stand in a high-temperature and high-humidity environment for a long period of time, so that the insulation property is improved, and an electronic device having good reliability can be realized.

Also, according to the bonding material of the present invention, the bonding material at least contains metal particles that are melted at a first temperature T1, a thermosetting resin that is cured at a second temperature T2 that is higher than the first temperature T1, and an activating agent that is activated at a third temperature T3 that is lower than the second temperature T2 so as to remove an oxide layer formed on a surface of the metal particles; the viscosity of contained components except the metal particles at the first temperature T1 is 0.57 Pa·s or less; and the first temperature T1 and the third temperature T3 satisfy T1−T3<50° C. Therefore, the metal particles and the activating agent flow and move sufficiently before the thermosetting resin is cured and, when the thermosetting resin is cured, the melted metal particles are firmly bonded to the electrodes and other metal particles that flow and move in the thermosetting resin without intervention of an oxide layer. Also, since the fluidity of the thermosetting resin is good, the thermosetting resin can be let to flow and move into the gap formed between the electrode bonding parts to fill the gap by simply applying the bonding material onto the electrodes of one electronic component, thereby contributing to an improvement in the mechanical strength of the electronic device. Further, even when the bonding material is applied onto a surface including the electrodes of one electronic component, the metal particles move towards the electrode side by combination of the fluidizing function of the thermosetting resin, the activation function of the activating agent, and the wetting function of the metal particles to the electrodes. Therefore, in the electrode bonding parts, the metal particles are firmly bonded with each other, and also the metal particles are firmly bonded to the electrodes. On the other hand, between the electrode bonding parts, only the thermosetting resin remains, thereby contributing to an improvement in the mechanical strength and an improvement in the insulation reliability of the electronic device.

Also, the method for producing an electronic device according to the present invention includes the steps of applying a bonding material described in any one of the above onto the electrodes of the one electronic component and thereafter disposing the electrodes of the other electronic component onto the bonding material, and performing a heating treatment to melt the metal particles contained in the bonding material and to activate the activating agent contained in the bonding material to remove an oxide layer formed on the surface of the metal particles, so as to bond the electrodes of the one electronic component and the electrodes of the other electronic component via the melted metal to form two or more electrode bonding parts that are electrically insulated from each other and, in the meantime, to fluidize the thermosetting resin contained in the bonding material so as to fill a gap formed between the electrode bonding parts with the thermosetting resin. Therefore, even when the bonding material is applied only onto the electrodes of one electronic component, the electrodes are firmly bonded with each other via a solder because the fluidity of the bonding material is good. Further, since the thermosetting resin flows and moves to the gap between the electrode bonding parts to fill the gap, generation of a distortion or the like in the electronic components can be suppressed even when a predetermined heat cycle is imposed as a load at the time of use, and the bonding state of the metal with each other and the bonding state between the metal and the electrodes can be firmly maintained. In other words, the structural defects such as exfoliation or cracks in the inside of the metal or between the metal and the electrode are suppressed, so that an electronic device with improved mechanical strength, electrical connection property, and insulation reliability can be obtained.

Also, the method for producing an electronic device according to the present invention includes the steps of applying a bonding material described in any one of the above onto a surface including the electrodes of the one electronic component and thereafter disposing the other electronic component onto the bonding material, and performing a heating treatment to melt the metal particles contained in the bonding material and to activate the activating agent contained in the bonding material to remove an oxide layer formed on the surface of the metal particles, so as to let the melted metal particles move to a site between the electrodes of the one electronic component and the electrodes of the other electronic component to bond between the electrodes so as to form two or more electrode bonding parts that are electrically insulated from each other and to fill between the electrode bonding parts with the thermosetting resin contained in the bonding material. Therefore, since the fluidity of the bonding material is good and the metal particles are easily bonded to the electrodes by the function of the activating agent, metal balls do not remain in the aforesaid gap, so that an electronic device having a good electrical connection property and a good insulation property can be obtained without generating a short-circuit or the like.

In particular, when a Sn—Bi-based alloy is used as the metal particles, the melted metal is prevented from spewing out between the electrode bonding parts, because Young's modulus of the Sn—Bi-based alloy is small and the cubical expansion coefficient thereof at the time of fusing is small. Therefore, short-circuiting and generation of cracks and the like caused by heat cycles can be suppressed.

DETAILED DESCRIPTION OF THE INVENTION

Next, embodiments of the present invention will be described in detail.

Figure 1:
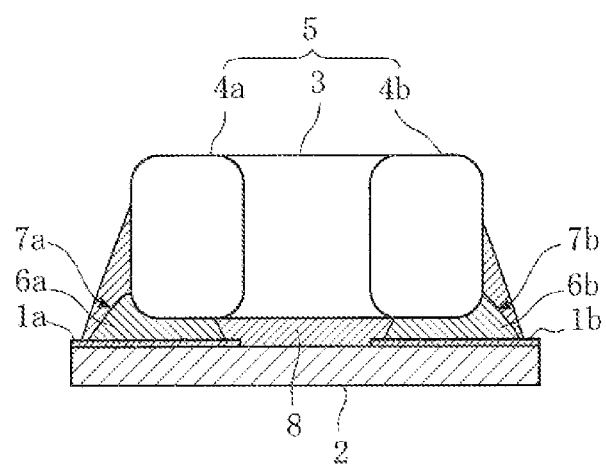
FIG. 1 is a cross-sectional view illustrating one embodiment of an electronic device according to the present invention.

FIG. 1 is a cross-sectional view illustrating one embodiment of an electronic device according to the present invention.

In this electronic device, a printed substrate 2 (electronic component) in which land electrodes 1a, 1b are formed and a chip-type electronic component 5 (electronic component) in which a pair of external electrodes 4a, 4b are formed at two ends of a component element body 3 are bonded via a solder 6 (metal), thereby to form electrode bonding parts 7a, 7b that are electrically insulated from each other. Further, the peripheries of the electrode bonding parts 7a, 7b are covered with a thermosetting resin 8, and a gap between the electrode bonding part 7a and the electrode bonding part 7b, that is, between non-electrode-forming part on the printed substrate 2 and the component element body 3, is filled with the aforesaid thermosetting resin 8.

Here, the substrate material used for the printed substrate 2 is not particularly limited, so that an arbitrary material such as glass epoxy or bakelite can be used.

Also, the electrode material for forming the land electrodes 1a, 1b is not particularly limited, so that an arbitrary electroconductive material such as Ag, Cu, or Ni can be used, and also those in which a Au layer or the like is formed by plating on the surface can be used.

Also, the chip-type electronic component 5 is not particularly limited as long as it can be subjected to surface mounting. For example, a resistor, a laminated ceramic capacitor, a piezoelectric component, a coil component, various IC chip components, semiconductor components, and the like can be used.

Also, the electrode material for forming the external electrodes 4a, 4b is not particularly limited, so that, for example, those in which a Ni layer, a Sn layer, a Au layer, or the like is formed by plating on the surface of an underlayer electrode formed of Ag or Cu can be used.

Further, in the present embodiment, the gap between the electrode bonding part 7a and the electrode bonding part 7b is filled with the thermosetting resin 8, so that the mechanical strength is improved; the reliability of electrical connection is improved; and a good insulation property can be obtained, thereby achieving an improvement in the durability.

In other words, in a conventional electronic device such as disclosed in Patent Document 1, a void gap is formed between the electrode bonding part 7a and the electrode bonding part 7b, so that, when a predetermined heat cycle is imposed as a load at the time of use, a distortion is generated in the printed substrate 2 having a small thickness due to the difference in thermal expansion coefficient from the printed substrate 2, the chip-type electronic component 5, and others, thereby raising a fear of inviting decrease in the mechanical strength and inviting decrease in the reliability of electrical connection property in the electrode bonding parts 7a, 7b. Also, when the electronic device is exposed to high-temperature and high-humidity conditions for a long period of time, the electrode bonding parts 7a, 7b absorb moisture, and the moisture penetrates into the electrode bonding parts 7a, 7b, thereby raising a fear of decrease in the insulation resistance and deterioration of the reliability.

Thus, in the present embodiment, the gap between the electrode bonding part 7a and the electrode bonding part 7b is filled with the thermosetting resin 8 to evade distortion of the printed substrate 2 and also, even if the printed substrate 2 is distorted, the stress caused by distortion is alleviated. This allows that the mechanical strength and the reliability of electrical connection property are improved, and also penetration of moisture into the electrode bonding parts 7a, 7b is evaded as much as possible, thereby achieving an improvement in the reliability of insulation property.

Thus, in the present electronic device, the gap between the electrode bonding parts 7a, 7b is filled with the thermosetting resin 8, so that the mechanical strength is improved, and exfoliation or generation of structural defects such as cracks in the inside of the solder 6a, 6b or between the solder 6a, 6b and the land electrodes 1a, 1b and/or the external electrodes 4a, 4b can be suppressed. Further, since the mechanical strength is thus improved, the bonding state in the inside of the solder 6a, 6b and the bonding state between the solder 6a, 6b and the land electrodes 1a, 1b and/or the external electrodes 4a, 4b are made firm, so that the reliability of electrical connection property is improved. Also, as described above, since the gap between the electrode bonding parts 7a, 7b is filled with the thermosetting resin 8, the electrode bonding parts can be prevented as much as possible from absorbing moisture even when the electronic device is left to stand in a high-temperature and high-humidity environment for a long period of time, so that the insulation property is improved, and an electronic device having good reliability can be realized.

Next, a bonding material used for fabrication of the above electronic device will be described in detail.

The present bonding material contains at least solder particles (metal particles), a thermosetting resin, and an activating agent functioning as a reducing agent.

In the present bonding material, the melted solder particles flow and move in the thermosetting resin and are brought into contact with other solder particles and the external electrodes 4a, 4b and/or the land electrodes 1a, 1b so as to be bonded thereto by fusion. Also, firm bonding can be made when it is made easier for the melted solder particles to flow and move in the thermosetting resin as much as possible and the period of time in which the melted solder particles can flow and move is as long as possible.

Therefore, in order to bond the land electrodes 1a, 1b and the external electrodes 4a, 4b in a good state via the solder 6a, 6b, the fluidity of the solder particles in the thermosetting resin is a critical factor. Further, the fluidity of the solder particles in the thermosetting resin is dependent on the viscosity of contained components (thermosetting resin, activating agent, and the like) except the solder particles at the melting point T1 (first temperature) of the solder particles, that is, the viscosity of the material containing resin as a major component and excluding the solder particles (hereafter simply referred to as "resin viscosity").

Further, by setting the resin viscosity at the melting point T1 of the solder particles to be 0.57 Pa·s or less, the fluidity of the thermosetting resin will be good, and therefore the fluidity of the melted solder will be good, whereby the solder particles are easily brought into contact with other solder particles and the external electrodes 4a, 4b or the land electrodes 1a, 1b to be welded thereto, and firm bonding can be made.

Here, the lower limit of the resin viscosity is not particularly limited as long as the material can be made into a paste; however, the lower limit is typically adjusted to be 0.001 Pa·s or higher.

Also, in order that the solder particles are welded to each other or the solder particles are welded to land electrodes 1a, 1a and the external electrodes 4a, 4b, fusion alone of the solder particles is insufficient, and there is a need to remove the oxide layer formed on the surface of the solder particles. In other words, an oxide layer is typically formed on the surface of the solder particles, so that the oxide layer remains on the surface of the solder particles even after the inside of the solder particles is melted. Therefore, in a state in which an oxide layer is formed on the surface of the solder particles, the solder particles are brought into contact with other solder particles, land electrodes 1a, 1a and the external electrodes 4a, 4b via the oxide layer, thereby raising a fear that a desired electrical connection property cannot be ensured. Thus, in order to overcome such a situation, there is a need to allow an activating agent having a reduction function to be contained in the bonding material so as to allow the activating agent to be brought into contact with the surface of the solder particles to generate an oxidation-reduction reaction to remove the oxide layer.

Therefore, in order to provide a good bonding state between the land electrodes 1a, 1b and the external electrodes 4a, 4b, the fluidity of the solder particles in the thermosetting resin must be made good, and also a mutual relationship among the melting point T1 of the solder particles, the curing temperature T2 of the thermosetting resin, and the activation temperature T3 (third temperature) of the activating agent is critical.

Thus, in the present embodiment, the component composition of the bonding material is adjusted so that the mutual relationship among these may satisfy the following numerical formulas (1) to (3).

$$T1 < T2 \tag{1}$$

$$T3 < T2 \tag{2}$$

$$T1 - T3 < 50° \text{ C.} \tag{3}$$

In other words, the melting point T1 of the solder particles and the activation temperature T3 of the activating agent are set to be lower than the curing temperature T2 of the thermosetting resin, and it is so set that the activation temperature T3 of the activating agent, even when being lower than the melting point T1 of the solder particles, is not by 50° C. or more lower than the melting point T1.

Hereafter, the reason why the melting point T1 of the solder particles, the curing temperature T2 of the thermosetting resin, and the activation temperature T3 of the activating agent are set to satisfy the above (1) to (3) will be described.

(1) Relationship Between the Melting Point T1 of the Solder Particles and the Curing Temperature T2 of the Thermosetting Resin When the melting point T1 of the solder particles is higher than the curing temperature T2 of the thermosetting resin, the thermosetting resin starts to be cured before the solder particles are melted, thereby making it difficult to let the solder particles flow and move sufficiently in the thermosetting resin and making it difficult to obtain a good bonding state.

Thus, in the present embodiment, the component composition of the bonding material is adjusted so that the melting point T1 of the solder particles is lower than the curing temperature T2 of the thermosetting resin, that is, a relationship of T1<T2 is satisfied.

(2) Relationship Between the Curing Temperature T2 of the Thermosetting Resin and the Activation Temperature T3 of the Activating Agent When the activation temperature T3 of the activating agent is higher than the curing temperature T2 of the thermosetting resin, the activating agent is liquefied and activated after the thermosetting resin starts to be cured, so that it will be difficult to generate a desired oxidation-reduction reaction on the surface of the solder particles, thereby raising a fear that the solder particles may not be bonded with each other in a good state.

Thus, in the present embodiment, the component composition of the bonding material is adjusted so that the activation temperature T3 of the activating agent is lower than the curing temperature T2 of the thermosetting resin, that is, a relationship of T3<T2 is satisfied.

(3) Relationship Between the Melting Point T1 of the Solder Particles and the Activation Temperature T3 of the Activating Agent As described above, by setting the melting point T1 of the solder particles and the activation temperature T3 of the activating agent to be lower than the curing temperature T2 of the thermosetting resin, the solder particles and the activating agent are melted before the thermosetting resin is cured, so that the solder particles can be let to flow and move in the thermosetting resin while removing the oxide layer on the surface of the solder particles by a reduction function of the activating agent, thereby providing a firm bonding of the solder particles with each other or of the solder particles to the electrodes (the land electrodes 1a, 1b, the external electrodes 4a, 4b).

However, when the activation temperature T3 is lower than the melting point T1 of the solder particles by 50° C. or more, the activating agent is liquefied and fluidized at a considerably early stage before the solder particles are melted. Therefore, in order to allow an oxidation-reduction reaction to take place effectively at the time point when the solder particles start to be melted, a large amount of the activating agent must be contained in advance.

However, when a large amount of the activating agent is contained in the bonding material, there is a possibility that the physical property after curing of the thermosetting resin may be deteriorated, thereby raising a fear of inviting deterioration of the characteristics of the electronic device.

Thus, in the present embodiment, the component composition of the bonding material is adjusted so that the activation temperature T3 of the activating agent is not by 50° C. or more lower than the melting point T1 of the solder particles, that is, a relationship of T1−T3<50° C. is satisfied.

Here, when the activation temperature T3 of the activating agent is higher than the melting point T1 of the solder particles, the degree thereof is not particularly limited; however, when the activation temperature T3 of the activating agent becomes high, the curing temperature T2 of the thermosetting resin must be raised accordingly, so that, even when the activation temperature T3 of the activating agent is higher than the melting point T1 of the solder particles, the temperature difference thereof is preferably less than 50° C.

Also, the volume content of the activating agent is typically set to be 0.1 to 16 vol % relative to the whole of the bonding material in consideration of the characteristics of the electronic device and others described above.

Also, the content of the solder particles in the bonding material is not particularly limited; however, the content is preferably 50 vol % or less in volume ratio. When the volume content of the solder particles exceeds 50 vol %, the volume content of the solder particles will be excessive, and the fluidity of the bonding material will be poor, so that, when screen printing is carried out at a typical printing speed (for example, 50 mm/sec), a so-called printing obscurity is liable to be generated. Therefore, when the volume content of the solder particles exceeds 50 vol %, the printing speed must be reduced, so that it is not preferable in consideration of the productivity.

In the meantime, by the results of research by the present inventors and others, it has been confirmed that, when the volume content of the solder particles is 10 vol % or more, good electrical bonding property and good mechanical strength can be obtained. However, when the volume content of the solder particles is less than 15 vol %, the volume content of the solder particles will be small, so that, when the bonding material is applied also to the non-electrode-forming part of the printed substrate, the melted solder particles will be separated from each other by distance, and there will be solder particles that are not sufficiently welded, thereby raising a fear that solder balls may remain in the non-electrode-forming part.

Therefore, the volume content of the solder particles is preferably 10 vol % or more and 50 vol % or less, more preferably 15 vol % or more and 50 vol % or less.

In this manner, according to the present bonding material, since the melting point T1 of the solder particles and the activation temperature T3 of the activating agent are lower than the curing temperature T2 of the thermosetting resin, the solder particles and the activating agent flow and move sufficiently before the thermosetting resin is cured. Further, when the thermosetting resin is cured, the melted solder particles are firmly bonded to other solder particles that flow and move in the thermosetting resin and to the land electrodes 1a, 1b and the external electrodes 4a, 4b without intervention of an oxide layer. Also, since the resin viscosity is as low as 0.57 Pa·s or less to provide a good fluidity of the thermosetting resin, the thermosetting resin flows and moves into a gap formed between the electrode bonding parts 7a, 7b to fill the gap by simply applying the bonding material onto the land electrodes 1a, 1b of the printed substrate 2, thereby contributing to an improvement in the mechanical strength of the electronic device.

Also, even when the bonding material is applied onto a surface including the land electrodes 1a, 1a of the printed substrate 2, the solder particles move towards the electrode side by combination of the fluidizing function of the thermosetting resin, the activation function of the activating agent, and the wetting function of the solder particles to the electrodes. Therefore, in the electrode bonding parts 7a, 7b, the solder particles are firmly bonded with each other, and also the solder particles are firmly bonded to the land electrodes 1a, 1b and the external electrodes 4a, 4b. On the other hand, between the electrode bonding parts 7a, 7b, only the thermosetting resin remains, thereby achieving an improvement in the mechanical strength and an improvement in the insulation reliability of the electronic device.

Further, the solder particles such as described above are not particularly limited as long as the melting point T1 satisfies the above numerical formulas (1) and (3). However, when solder particles having a high melting point T1 are used, a thermosetting resin having a high curing temperature T2 must be used, so that the heating temperature must also be raised. Therefore, it is preferable to use solder particles having a low melting point such as a Sn—Bi-based alloy or a Sn—Pb-based alloy.

In particular, a Sn—Bi-based alloy is more preferable because Young's modulus thereof is small and the cubical expansion coefficient thereof at the time of fusing is small. In other words, when melted, the metal is prevented from spewing out between the electrodes, because Young's modulus of the Sn—Bi-based alloy is small and the cubical expansion coefficient thereof at the time of fusing is small.

Therefore, generation of short-circuiting and generation of cracks in heat cycles can be effectively suppressed. Also, the Sn—Bi-based alloy has an advantage of alleviating the load imposed on the environment because the Sn—Bi-based alloy is of a non-lead type.

Also, it is sufficient that the contained components except the solder particles are prepared so that the resin viscosity is 0.57 Pa·s or less and also the numerical formulas (1) to (3) are satisfied, so that the material species are not particularly limited. For example, a thermosetting resin is typically formed by adding a curing agent into a resin material. As a resin material, an epoxy-based resin is typically used. As a curing agent, imidazoles, amines, triazines, and the like can be used, for example. Also, as the activating agent, for example, adipic acid, glutaric acid, succinic acid, and the like are widely known. As a viscosity adjusting agent, polyamide-based compounds are known.

Further, the present bonding material is prepared by suitably blending these various resin materials, curing agents, activating agents, viscosity adjusting agents, and others so that the resin viscosity is 0.57 Pa·s or less and also the numerical formulas (1) to (3) are satisfied.

FIG. 2 is a cross-sectional view for describing a first embodiment of a method for producing an electronic device using the bonding material described above.

Figure 2A:
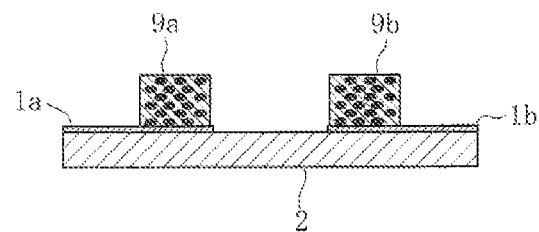
FIGS. 2(a) to 2(c) are cross-sectional views for describing a first embodiment of a method for producing the electronic device according to the present invention.

First, referring to FIG. 2(a), bonding materials 9a, 9b are applied onto the land electrodes 1a, 1b formed on a surface of the printed substrate 2.

Figure 2B:
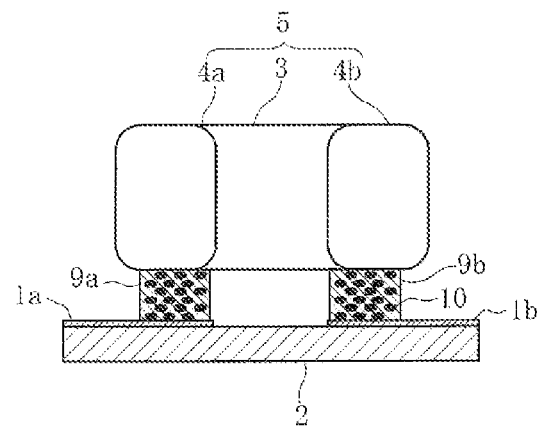

Subsequently, referring to FIG. 2(b), the chip-type electronic component 5 is mounted on the printed substrate 2 so that the external electrodes 4a, 4b are positioned above the land electrodes 1a, 1b.

Figure 2C:
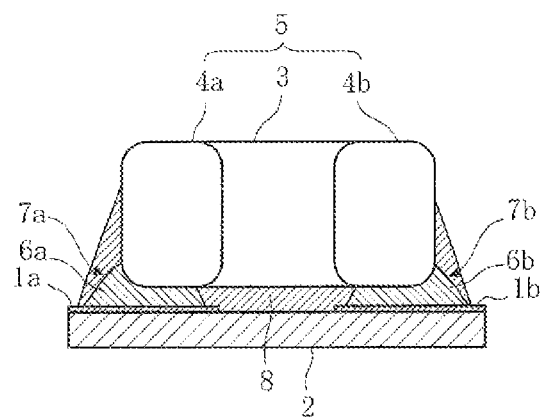

Further, when a heating treatment is carried out, the solder particles 10 and the activating agent are melted before the thermosetting resin in the bonding materials 9a, 9b starts to be cured, whereby an oxide layer on the surface of the solder particles 10 is removed by an activating function (reduction function) of the activating agent. This allows that the solder particles 10 are welded to each other, and the solder particles 10 are welded to the land electrodes 1a, 1b and the external electrodes 4a, 4b, thereby to form the electrode bonding parts 7a, 7b in which the solders 6a, 6b are bonded to the land electrodes 1a, 1b and the external electrodes 4a, 4b, as shown in FIG. 2(c). Further, the thermosetting resin 8 covers a part of the end surface of the external electrodes 4a, 4b and also flows and moves to a gap between the component element body 3 and the printed substrate 2 to fill the gap.

In this manner, in the present first embodiment, the method includes the steps of applying the bonding materials 9a, 9b of the present invention onto the land electrodes 1a, 1b of the printed substrate 2 and thereafter disposing the external electrodes 4a, 4b of a chip-type component 5 onto the bonding materials 9a, 9b, and performing a heating treatment to melt the solder particles 10 in the bonding materials 9a, 9b and to activate the activating agent to remove an oxide layer formed on a surface of the solder particles 10, so as to bond the land electrodes 1a, 1b and the external electrodes 4a, 4b via the solders 6a, 6b being melted to form the electrode bonding parts 7a, 7b that are electrically insulated from each other and, in the meantime, to fluidize the thermosetting resin in the bonding materials 9a, 9b so as to fill a gap formed between the electrode bonding parts 7a, 7b with the thermosetting resin 8. Therefore, the land electrodes 1a, 1b and the external electrodes 4a, 4b are firmly bonded with each other via a solder 6 because the fluidity of the bonding materials 9a, 9b is good. Further, since the thermosetting resin 8 flows and moves to the gap between the electrode bonding parts 7a, 7b to fill the gap, generation of a distortion or the like in the printed substrate 2 can be suppressed at the time of use after the substrate is mounted. Also, even if a distortion or the like is generated, the stress thereof can be alleviated, thereby achieving an improvement in the mechanical strength and in the electrical connection property.

FIG. 3 is a cross-sectional view for describing a second embodiment of a method for producing an electronic device.

Figure 3A:
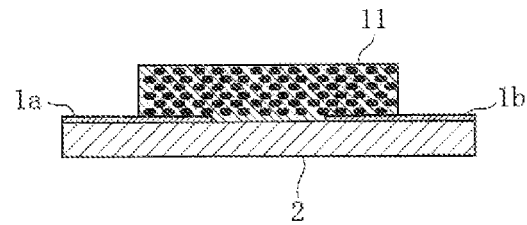
FIGS. 3(a) to 3(c) are cross-sectional views for describing a second embodiment of the method for producing an electronic device according to the present invention.

First, referring to FIG. 3(a), a bonding material 11 is applied onto a surface including electrodes 1a, 1b of a printed substrate 2.

Figure 3B:
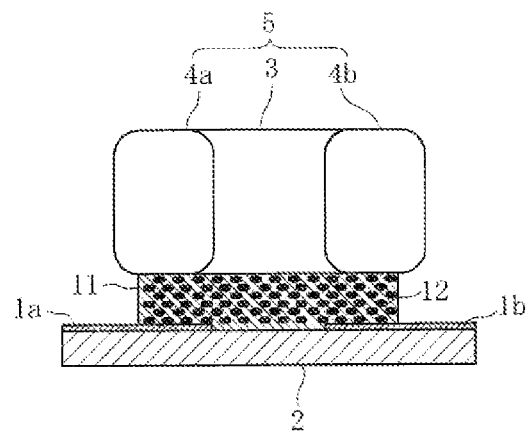

Subsequently, referring to FIG. 3(b), a chip-type electronic component 5 is mounted on the printed substrate 2 so that external electrodes 4a, 4b are positioned above the land electrodes 1a, 1b.

Figure 3C:
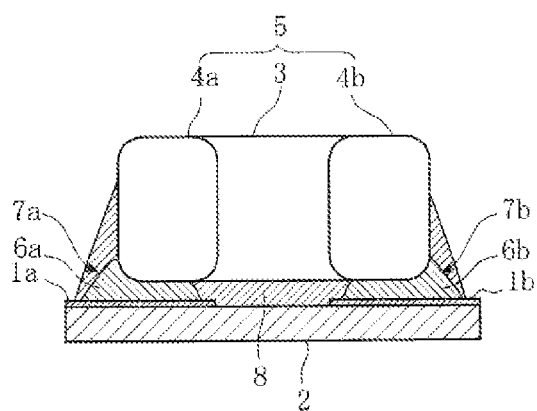
Figure 4:
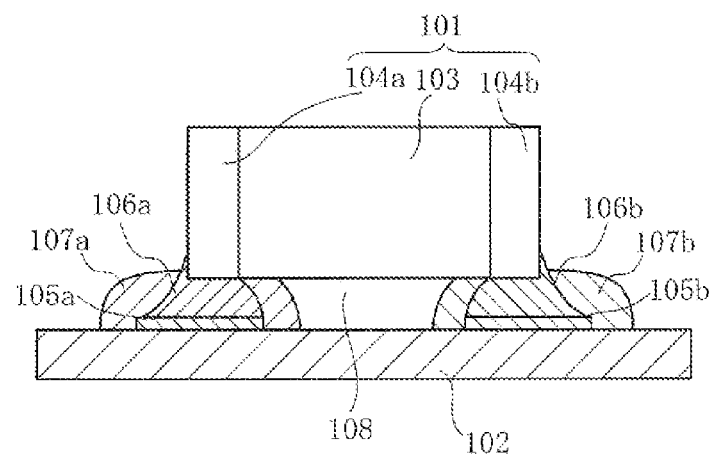
FIG. 4 is a cross-sectional view of a conventional electronic device disclosed in Patent Document 1.

Further, when a heating treatment is carried out, solder particles 12 and the activating agent are melted before the thermosetting resin in the bonding material 11 starts to be cured, whereby an oxide layer on the surface of the solder particles 12 is removed by an activating function (reduction function) of the activating agent. This allows that the melted solder particles move as if being attracted to the electrode (the land electrodes 1a, 1b, the external electrodes 4a, 4b) side, and solder particles are welded to each other and to the aforesaid electrodes, thereby to form electrode bonding parts 7a, 7b. Further, since the solder particles 12 move towards the electrode side, only a thermosetting resin 8 remains in the gap between a component element body 3 and the printed substrate 2, as shown in FIG. 3(c).

In this manner, in the present second embodiment, the method includes the steps of applying the bonding material 11 of the present invention onto a surface including the land electrodes 1a, 1b of the printed substrate 2 and thereafter disposing the chip-type electronic component 5 onto the bonding material 11, and performing a heating treatment to melt the solder particles 12 in the bonding material 11 and to activate the activating agent in the bonding material 11 to remove an oxide layer formed on a surface of the solder particles 12, so as to let the solder particles 12 being melted move to a site between the land electrodes 1a, 1b and the external electrodes 4a, 4b to bond between the electrodes so as to form two or more of the electrode bonding parts 7a, 7b that are electrically insulated from each other and to fill the gap formed between the electrode bonding parts 7a, 7b with the thermosetting resin 8 of the bonding material 11. Therefore, since the fluidity of the bonding material is good and the solder particles are easily bonded to the electrodes by the function of the activating agent, solder balls do not remain in the aforesaid gap, so that an electronic device having a good electrical connection property and a good insulation property can be obtained without generating a short-circuit or the like.

Here, the present invention is not limited to the above-described embodiments. In the aforesaid embodiments, the printed substrate 2 is used as one electronic component and the chip-type electronic component 5 is used as another electronic component; however, the present invention is not limited to these. For example, with respect to substrates, it goes without saying that the present invention can be applied to various substrates such as aluminum substrates, silicon substrates, and ceramic multilayer substrates in addition to printed substrates. Also, the other electronic component is not limited to a chip-type electronic component and may sufficiently be one having two or more electrodes for mounting.

Also, the present invention can be widely applied to cases in which two or more kinds of electronic components are bonded.

Hereafter, Examples of the present invention will be specifically described.

Example 1

[Preparation of Bonding Material]

As resin materials, bisphenol-A type epoxy resin having a liquid form and having a molecular weight of 380 (hereafter referred to as "epoxy resin (1)"), bisphenol-A type epoxy resin having a solid form and having a molecular weight of 900 (hereafter referred to as "epoxy resin (2)"), and tertiary-butylglycidyl ether (hereafter referred to as "t-BuGE") were prepared.

As solder particles, three kinds of Sn—Bi alloys in which the content ratio of Sn and Bi was such that Sn:Bi=42:58 (hereafter referred to as "Sn-58Bi"), Sn:Bi=30:70 (hereafter referred to as "Sn-70Bi"), and Sn:Bi=20:80 (hereafter referred to as "Sn-80Bi") in weight ratio were prepared.

Also, as activating agents, adipic acid, glutaric acid, succinic acid, decanoic acid, and fumaric acid were prepared.

Also, as curing agents of resin, 2-phenyl-4-methyl-5-hydroxymethylimidazole (hereafter referred to as "imidazole compound"), 2,4-diamino-6-[2'-ethyl-4'-methylimidazolyl-(1')]-ethyl-s-triazine (hereafter referred to as "triazine compound)", denatured polyamine, and phenolic resin were prepared. As viscosity adjusting agents, a polyamide-based compound, acrylonitrile-butadiene copolymer (hereafter referred to as "nitrile rubber"), fine powder silica, and carbon black were prepared.

Subsequently, various materials were weighed so that each of the above materials would have a content in vol % as shown in Table 1. Further, these weighed substances were stirred in vacuum for about 60 minutes by using a planetary mixer, whereby the bonding materials of Sample Nos. 1 to 23 were fabricated.

Table 1 shows the material species and vol % of the bonding materials of Sample Nos. 1 to 23.

TABLE 1

| Sample No. | Main resin | | Sub-resin | | Solder particles | | Activating agent | | Curing agent | | Viscosity adjusting agent | |
|---|---|---|---|---|---|---|---|---|---|---|---|---|
| | Material species | Content (vol %) | Material species | Content (vol %) | Material species | Content (vol %) | Material species | Content (vol %) | Material species | Content (vol %) | Material species | Content (vol %) |
| 1 | Epoxy (1) | 53 | — | — | Sn—58Bi | 37 | Adipic acid | 5 | Imidazole compound | 3 | Polyamide-based compound | 2 |
| 2 | Epoxy (1) | 43 | t-BuGE | 10 | Sn—58Bi | 37 | Adipic acid | 5 | Imidazole compound | 3 | Polyamide-based compound | 2 |
| 3 | Epoxy (1) | 32 | t-BuGE | 21 | Sn—58Bi | 37 | Adipic acid | 5 | Imidazole compound | 3 | Polyamide-based compound | 2 |
| 4 | Epoxy (1) | 53 | — | — | Sn—58Bi | 37 | Glutaric acid | 5 | Imidazole compound | 3 | Polyamide-based compound | 2 |
| 5 | Epoxy (1) | 53 | — | — | Sn—58Bi | 37 | Succinic acid | 5 | Triazine compound | 3 | Polyamide-based compound | 2 |
| 6 | Epoxy (1) | 53 | — | — | Sn—70Bi | 37 | Adipic acid | 5 | Triazine compound | 3 | Polyamide-based compound | 2 |
| 7 | Epoxy (1) | 53 | — | — | Sn—80Bi | 37 | Succinic acid | 5 | Triazine compound | 3 | Polyamide-based compound | 2 |
| 8*** | Epoxy (1) | 82 | — | — | Sn—58Bi | 10 | Adipic acid | 1 | Imidazole compound | 4 | Polyamide-based compound | 3 |
| 9 | Epoxy (1) | 76 | — | — | Sn—58Bi | 15 | Adipic acid | 2 | Imidazole compound | 4 | Polyamide-based compound | 3 |
| 10 | Epoxy (1) | 40 | — | — | Sn—58Bi | 50 | Adipic acid | 6 | Imidazole compound | 2 | Polyamide-based compound | 1 |
| 11** | Epoxy (1) | 35 | — | — | Sn—58Bi | 55 | Adipic acid | 7 | Imidazole compound | 2 | Polyamide-based compound | 1 |
| 12* | Epoxy (1) | 32 | Epoxy (2) | 22 | Sn—58Bi | 38 | Adipic acid | 5 | Imidazole compound | 3 | — | 0 |
| 13* | Epoxy (1) | 53 | — | — | Sn—58Bi | 37 | Decanoic acid | 5 | Imidazole compound | 3 | Polyamide-based compound | 2 |
| 14* | Epoxy (1) | 53 | — | — | Sn—58Bi | 37 | Succinic acid | 5 | Imidazole compound | 3 | Polyamide-based compound | 2 |
| 15* | Epoxy (1) | 53 | — | — | Sn—58Bi | 37 | Fumaric acid | 5 | Imidazole compound | 3 | Polyamide-based compound | 2 |
| 16* | Epoxy (1) | 50 | — | — | Sn—58Bi | 37 | Glutaric acid | 5 | Denatured polyamine | 7 | Polyamide-based compound | 2 |
| 17* | Epoxy (1) | 33 | — | — | Sn—58Bi | 37 | Adipic acid | 5 | Phenolic resin/ imidazole compound | 25 | — | 1 |
| 18* | Epoxy (1) | 45 | — | — | Sn—58Bi | 37 | Adipic acid | 5 | Imidazole compound | 2 | Nitrile rubber | 11 |
| 19* | Epoxy (1) | 37 | — | — | Sn—58Bi | 37 | Adipic acid | 5 | Imidazole compound | 2 | Nitrile rubber | 19 |
| 20* | Epoxy (1) | 52 | — | — | Sn—58Bi | 37 | Adipic acid | 9 | Imidazole compound | 2 | — | 0 |
| 21* | Epoxy (1) | 52 | — | — | Sn—58Bi | 37 | Adipic acid | 5 | Imidazole compound | 6 | — | 0 |
| 22* | Epoxy (1) | 55 | — | — | Sn—58Bi | 37 | Adipic acid | 5 | Imidazole compound | 3 | Fine powder silica | 1 |

TABLE 1-continued

| Sample No. | Main resin | | Sub-resin | | Solder particles | | Activating agent | | Curing agent | | Viscosity adjusting agent | |
|---|---|---|---|---|---|---|---|---|---|---|---|---|
| | Material species | Content (vol %) | Material species | Content (vol %) | Material species | Content (vol %) | Material species | Content (vol %) | Material species | Content (vol %) | Material species | Content (vol %) |
| 23* | Epoxy (1) | 55 | — | — | Sn—58Bi | 37 | Adipic acid | 5 | Imidazole compound | 3 | Carbon black | 1 |

*is out of the scope of the present invention (claim 1)
**is out of the scope of the present invention (claim 6)
***is out of the scope of the present invention (claim 8)

[Fabrication of Evaluation Samples]

A printed substrate made of glass epoxy and having a pair of land electrodes in which a Au layer had been formed on a surface of an underlayer made of Ni was prepared. Here, the land electrodes had a size with a longitudinal length of 1.8 mm and a lateral length of 1.1 mm.

Also, a chip-type resistor having a resistance value of 10Ω and having a pair of external electrodes in which a Sn layer had been formed on a surface of an underlayer made of Ni was prepared. Here, this chip-type resistor had a size with a longitudinal length of 3.2 mm, a lateral length of 1.6 mm, and a height of 1.6 mm.

Subsequently, by using a metal mask having a thickness of 80 μm and having an opening with a longitudinal length of 1.8 mm and a lateral length of 1.1 mm, each of the bonding materials of Sample Nos. 1 to 23 was applied by printing onto the land electrodes at a printing speed of 50 mm/s.

Subsequently, the chip-type resistor was mounted with use of a mounter so that the external electrodes would be positioned above the land electrodes. Then, the resultant was passed through a reflow furnace set at 200° C. so as to fabricate 120 pieces of first evaluation samples for each of Sample Nos. 1 to 23.

Similarly, by using a metal mask having an opening with a size approximately the same as the plane area of the chip-type resistor, each of the bonding materials of Sample Nos. 1 to 23 was applied by printing onto the printed substrates at a printing speed of 50 mm/sec.

Subsequently, the chip-type resistor was mounted with use of a mounter so that the external electrodes would be positioned above the land electrodes. Then, the resultant was passed through a reflow furnace set at 200° C. so as to fabricate 120 pieces of second evaluation samples for each of Sample Nos. 1 to 23.

[Evaluation of Physical Properties and Characteristics of Evaluation Samples]

(Measurement of Melting Point T1 of Solder Particles and Activation Temperature T3 of Activating Agent)

By using a differential scanning calorimeter (DSC6200 manufactured by Seiko Instruments Co., Ltd.), DSC (differential scanning calorimetry) measurement was carried out each for the solder particles and the activating agent. Further, with respect to the solder particles made of alloy, the peak temperature on the highest-temperature side among the endothermic peaks in a measurement chart was regarded as the melting point T1 of the solder particles. With respect to the activating agent, the peak temperature that exhibited an endotherm was regarded as the activation temperature T3.

(Measurement of Resin Viscosity and Curing Temperature T2)

Samples in which the solder particles had been excluded in the bonding materials were separately fabricated, and the resin viscosity was measured by using a rheometer (AR-G2 manufactured by TA Instruments Co., Ltd.). Here, the measurement was carried out by setting the gap size of the rheometer to be 500 μm and the temperature-raising speed to be 7.5° C./min and setting the measurement frequency to be 100 Hz.

Also, together with the measurement of resin viscosity, the temperature-viscosity characteristics were measured. The temperature at which the viscosity started to rise was determined as the curing temperature T2 of the thermosetting resin.

(Electrical Characteristics)

With respect to the first evaluation samples, the electrical characteristics were evaluated by measuring the resistance value between the land electrodes on the printed substrate by using a nanovolt/microohm·meter (34420A manufactured by Agilent Technologies Inc.). In other words, the samples in which none among the 120 pieces had a measurement value exceeding a range of 10±1Ω were regarded as good products (O), and the samples in which one or more among the 120 pieces had a measurement value exceeding the range were regarded as poor products (x), so as to evaluate the electrical characteristics of the first evaluation samples.

Also, with respect to the second evaluation samples, the electrical characteristics were evaluated by a method similar to the one used in evaluating the first evaluation samples.

(State of Filling with Thermosetting Resin)

With respect to each of the first evaluation samples, the cross-section thereof was observed by using a microscope (VHX900 manufactured by KEYENCE CORPORATION), so as to determine by eye inspection whether the gap between the component element body and the printed substrate was filled with the thermosetting resin. The samples in which the gap was determined to be completely filled were regarded as good products (O), and the samples in which a void gap or the like was recognized by eye inspection and the state of filling was determined to be incomplete were regarded as poor products (x), so as to evaluate the state of filling with the thermosetting resin.

(Presence or Absence of Solder Balls)

With respect to each of the second evaluation samples, X-ray transmission observation was carried out from the top surface of the chip-type resistor by using a microfocus X-ray fluoroscope (SMX-1000 manufactured by Shimadzu Corporation). The samples in which 10 or more solder balls were recognized between the printed substrate and the chip-type resistor were regarded as poor products (x), and the samples in which less than 10 solder balls were recognized were regarded as good products (O), so as to evaluate the presence or absence of solder balls between the electrode bonding parts.

Here, the evaluation of the presence or absence of solder balls is not necessarily an essential property, so that no problem is raised as long as the electrical characteristics are good. However, though no problem is raised as long as the electrical characteristics are good, it is preferable that no solder balls are present in view of mass production property such as variation among the lots.

(Printing Property)

When the bonding material was subjected to screen printing on the land electrodes or on the printed substrate at a printing speed of 50 mm/sec, the samples in which one or more states of printing obscurity were recognized in the samples were regarded as poor products (x), and the samples in which no state of printing obscurity was recognized were regarded as good products (O), so as to evaluate the printing property.

Table 2 shows the result of the measurements thereof.

completely move towards the electrode side, so that connection between the electrodes was not established.

Also, with respect to Sample Nos. 17 to 23, though the contained component species and the blending amount thereof were changed, the resin viscosity was as high as 1.23 to 2.20 Pa·s in all of these, so that a result similar to that of Sample No. 12 was obtained.

Also, with respect to Sample Nos. 13 to 15, though the printing property and the state of filling with the thermosetting resin in the first evaluation sample were good, good results were not obtained in other properties.

In other words, in Sample No. 13, though the fluidity was good because the resin viscosity was as low as 0.45 Pa·s, the activating agent is liquefied to be activated and consumed before the solder particles start to be melted because the

TABLE 2

| | | | | | | First evaluation samples | | | Second evaluation samples | | |
|---|---|---|---|---|---|---|---|---|---|---|---|
| Sample No. | Resin viscosity (Pa·s) | Melting point T1 (° C.) | Activation temperature T3 (° C.) | Curing temperature T2 (° C.) | T1 − T3 (° C.) | Electrical characteristics | State of filling with thermosetting resin | Printing property | Electrical characteristics | Presence or absence of solder balls | Printing property |
| 1 | 0.57 | 139 | 153 | 156 | −14 | o | o | o | o | o | o |
| 2 | 0.27 | 139 | 153 | 156 | −14 | o | o | o | o | o | o |
| 3 | 0.18 | 139 | 153 | 156 | −14 | o | o | o | o | o | o |
| 4 | 0.57 | 139 | 98 | 156 | 41 | o | o | o | o | o | o |
| 5 | 0.57 | 139 | 182 | 195 | −43 | o | o | o | o | o | o |
| 6 | 0.57 | 175 | 153 | 195 | 22 | o | o | o | o | o | o |
| 7 | 0.57 | 200 | 182 | 248 | 18 | o | o | o | o | o | o |
| 8*** | 0.57 | 139 | 153 | 156 | −14 | o | o | o | o | x | o |
| 9 | 0.57 | 139 | 153 | 156 | −14 | o | o | o | o | o | o |
| 10 | 0.57 | 139 | 153 | 156 | −14 | o | o | o | o | o | o |
| 11** | 0.57 | 139 | 153 | 156 | −14 | o | o | x | o | o | x |
| 12* | 1.22 | 139 | 153 | 156 | −14 | x | x | o | x | x | o |
| 13* | 0.45 | 139 | 31 | 156 | 108 | x | o | o | x | x | o |
| 14* | 0.57 | 139 | 182 | 156 | −43 | x | o | o | x | x | o |
| 15* | 0.57 | 139 | 286 | 156 | −147 | x | o | o | x | x | o |
| 16* | 0.66 | 139 | 98 | 139 | 41 | x | x | o | x | x | o |
| 17* | 1.80 | 139 | 153 | 158 | −14 | x | x | o | x | x | o |
| 18* | 1.67 | 139 | 153 | 156 | −14 | x | x | o | x | x | o |
| 19* | 2.20 | 139 | 153 | 156 | −14 | x | x | o | x | x | o |
| 20* | 1.23 | 139 | 153 | 156 | −14 | x | x | o | x | x | o |
| 21* | 1.44 | 139 | 153 | 156 | −14 | x | x | o | x | x | o |
| 22* | 1.51 | 139 | 153 | 156 | −14 | x | x | o | x | x | o |
| 23* | 1.56 | 139 | 153 | 156 | −14 | x | x | o | x | x | o |

*is out of the scope of the present invention (claim 1)
**is out of the scope of the present invention (claim 6)
***is out of the scope of the present invention (claim 8)

Also, with respect to Sample No. 12, the printing property was good in both of the first and second evaluation samples; however, in the first evaluation sample, the state of filling the gap between the printed substrate and the component element body with the thermosetting resin was incomplete. Also, in the second evaluation sample, there was a sample in which 10 or more solder balls were recognized to be present between the printed substrate and the component element body, and further, it was found out that the electrical characteristics were also deteriorated. This seems to be due to the following reason. Because the resin viscosity was 1.22 Pa·s which exceeded 0.57 Pa·s, the fluidity of the thermosetting resin was poor and, for this reason, the thermosetting resin did not flow to move sufficiently into the gap between the printed substrate and the component element body in the first evaluation sample, thereby producing a sample in which the state of filling with the thermosetting resin was incomplete. Also, with respect to the second evaluation sample, it seems that, because the fluidity of the thermosetting resin was poor as described above, the melted solder did not activation temperature T3 of the activating agent is lower than the melting point T1 of the solder particles by 50° C. or more. For this reason, the content of the activating agent was low when the solder particles started to be melted, so that the oxide layer on the solder particle surface layer could not be sufficiently removed, thereby decreasing the electrical connection property in the first evaluation sample.

Further, with respect to this Sample No. 13, because the oxide layer on the solder particle surface could not be sufficiently removed in the second evaluation sample also, the solder particles that could not move towards the electrode side increased. For this reason, there were solder particles that could not be bonded to other solder particles or to the electrodes, whereby one having a high resistance value was generated, and the electrical characteristics decreased.

Also, with respect to Sample Nos. 14 and 15, though the fluidity was good because the resin viscosity was as low as 0.57 Pa·s and also the state of filling with the thermosetting resin was good, the activating agent was activated after the thermosetting resin started to be cured because the activation temperature T3 of the activating agent was higher than the curing temperature T2 of the thermosetting resin, so that the activating agent could not exhibit a sufficient reduction function, and the electrical connection property decreased in the first and second evaluation samples in the same manner as in Sample No. 13.

With respect to Sample No. 16, because the resin viscosity was as high as 0.66 Pa·s to provide a poor fluidity, the state of filling with the thermosetting resin was also insufficient. Also, since the melting point T1 of the solder particles was equal to the curing temperature T2 of the thermosetting resin, the solder particles could not flow to move in the thermosetting resin and, for this reason, the electrical connection property decreased in the first and second evaluation samples.

In contrast, with respect to Sample Nos. 1 to 11, the resin viscosity is 0.57 Pa·s or less; the thermosetting resin T2 is higher than the melting point T1 of the solder particles and the activation temperature T2 of the activating agent; and also the activation temperature T3 of the activating agent, even if lower than the melting point T1 of the solder particles, is not by more than 50° C. lower than the melting point T1. Therefore, in the first and second evaluation samples, the state of filling the gap with the thermosetting resin was good, and an electronic device being excellent in mechanical strength and having a good electrical connection property could be obtained.

However, with respect to Sample No. 8, though the electrical connection property was good, the volume content of the solder particles was as small as 10 vol % and, for this reason, there were solder particles that could not be welded because they were spaced apart too much in distance, and presence of solder balls in the non-electrode-forming parts was confirmed.

Also, with respect to Sample No. 11, the volume content of the solder particles was 55 vol % and was excessive, so that printing obscurity was generated at the printing speed of 50 mm/sec, thereby confirming a poor printing property.

Example 2

As resin materials, epoxy resin (1), epoxy resin (2), and t-BuGE were prepared in the same manner as in Example 1.

As solder particles, a Sn—Pb alloy in which the content ratio of Sn and Pb was such that Sn:Pb=60:40 (hereafter referred to as "Sn-40Pb") in weight ratio was prepared.

Also, as activating agents, adipic acid, glutaric acid, and succinic acid were prepared.

Also, as a curing agent of resin, an imidazole compound was prepared.

Subsequently, various materials were weighed so that each of the above materials would have a content in vol % as shown in Table 3. Further, these weighed substances were stirred in vacuum for about 60 minutes by using a planetary mixer, whereby the bonding materials of Sample Nos. 31 to 35 were fabricated.

Table 3 shows the material species and vol % of the bonding materials of Sample Nos. 31 to 35.

TABLE 3

| Sample No. | Main resin | | Sub-resin | | Solder particles | | Activating agent | | Curing agent | | Viscosity adjusting agent | |
|---|---|---|---|---|---|---|---|---|---|---|---|---|
| | Material species | Content (vol %) | Material species | Content (vol %) | Material species | Content (vol %) | Material species | Content (vol %) | Material species | Content (vol %) | Material species | Content (vol %) |
| 31 | Epoxy (1) | 53 | — | — | Sn—40Pb | 37 | Adipic acid | 5 | Imidazole compound | 3 | Polyamide-based compound | 2 |
| 32 | Epoxy (1) | 43 | t-BuGE | 10 | Sn—40Pb | 37 | Adipic acid | 5 | Imidazole compound | 3 | Polyamide-based compound | 2 |
| 33 | Epoxy (1) | 32 | t-BuGE | 21 | Sn—40Pb | 37 | Adipic acid | 5 | Imidazole compound | 3 | Polyamide-based compound | 2 |
| 34 | Epoxy (1) | 53 | — | — | Sn—40Pb | 37 | Succinic acid | 5 | Imidazole compound | 3 | Polyamide-based compound | 2 |
| 35* | Epoxy (1) | 32 | Epoxy (2) | 21 | Sn—40Pb | 37 | Adipic acid | 5 | Imidazole compound | 3 | — | — |

*is out of the scope of the present invention (claim 1)

Subsequently, first and second evaluation samples of Sample Nos. 31 to 35 were fabricated by a method and a procedure similar to those of Example 1.

Further, the melting point T1 of the solder particles, the activation temperature T3 of the activating agent, the resin viscosity, and the curing temperature T2 were measured, and the electrical characteristics, the state of filling with the thermosetting resin, and presence or absence of solder balls were evaluated by a method and a procedure similar to those of Example 1.

Table 4 shows the result of the measurements thereof.

TABLE 4

| | | | | | | First evaluation samples | | | Second evaluation samples | | |
|---|---|---|---|---|---|---|---|---|---|---|---|
| Sample No. | Resin viscosity (Pa·s) | Melting point T1 (° C.) | Activation temperature T3 (° C.) | Curing temperature T2 (° C.) | T1 − T3 (° C.) | Electrical characteristics | State of filling with thermosetting resin | Printing property | Electrical characteristics | Presence or absence of solder balls | Printing property |
| 31 | 0.55 | 183 | 153 | 156 | 30 | ○ | ○ | ○ | ○ | ○ | ○ |
| 32 | 0.27 | 183 | 153 | 156 | 30 | ○ | ○ | ○ | ○ | ○ | ○ |
| 33 | 0.18 | 183 | 153 | 156 | 30 | ○ | ○ | ○ | ○ | ○ | ○ |
| 34 | 0.55 | 183 | 182 | 183 | 1 | ○ | ○ | ○ | ○ | ○ | ○ |
| 35* | 1.18 | 183 | 153 | 156 | 30 | x | x | ○ | x | x | ○ |

*is out of the scope of the present invention (claim 1)

With respect to Sample No. 35, the resin viscosity was as high as 1.18 Pa·s and, for this reason, the electrical characteristics and the state of filling with the thermosetting resin were poor due to the same reason as that of Sample No. 13 of Example 1, so that the device was inferior in mechanical strength, and also the presence of solder balls was confirmed.

In contrast, with respect to Sample Nos. 31 to 34, the resin viscosity is 0.57 Pa·s or less; the curing temperature T2 of the thermosetting resin is higher than the melting point T1 of the solder particles and the activation temperature T3 of the activating agent; and also the activation temperature T3 of the activating agent, though lower than the melting point T1 of the solder particles, is not by more than 50° C. lower than the melting point T1. Therefore, in the first and second evaluation samples, the state of filling with the thermosetting resin was good, and an electronic device being excellent in mechanical strength and having a good electrical connection property could be obtained.

A gap formed between a printed substrate and a component element body of a chip-type electronic component is filled with a thermosetting resin. This realizes an electronic device that can make an improvement in mechanical strength, reliability of electrical connection property, and reliability of insulation.

DESCRIPTION OF REFERENCE SYMBOLS 1a, 1b land electrode
2 printed substrate (electronic component)
3 component element body
4a, 4b external electrode
5 chip-type electronic component (electronic component)
6a, 6b solder (metal)
7a, 7b electrode bonding part
8 thermosetting resin
9a, 9b bonding material
10 solder particles (metal particles)
11 bonding material
12 solder particles (metal particles)

The invention claimed is:

1. An electronic device comprising:
a plurality of electronic components each having two or more electrodes, wherein one electronic component and another electronic component among the plurality of electronic components are electrically connected;
a metal bonding electrodes of the one electronic component and electrodes of the other electronic component to form two or more electrode bonding parts that are electrically insulated from each other; and
a first thermosetting resin filling a gap between one of the electrode bonding parts and another of the electrode bonding parts,
wherein the electrode bonding parts are formed from a bonding material comprising:
metal particles that are melted at a first temperature T1;
a second thermosetting resin that starts to be cured at a second temperature T2 that is higher than the first temperature T1; and
an activating agent that is activated at a third temperature T3 that is lower than the second temperature T2 so as to remove an oxide layer formed on a surface of the metal particles, wherein
a viscosity of contained components except the metal particles at the first temperature T1 is 0.57 Pa·s or less, and
the first temperature T1 and the third temperature T3 satisfy T1−T3<50° C.

2. The electronic device according to claim 1, wherein the metal contains a Sn—Bi-based alloy as a major component.

3. The electronic device according to claim 1, wherein the plurality of electronic components include a substrate having land electrodes and a chip-type component having external electrodes on a surface of a component element body, and
the land electrodes and the external electrodes are bonded via the metal to form the electrode bonding parts.

4. A bonding material comprising:
metal particles that are melted at a first temperature T1;
a thermosetting resin that starts to be cured at a second temperature T2 that is higher than the first temperature T1; and
an activating agent that is activated at a third temperature T3 that is lower than the second temperature T2 so as to remove an oxide layer formed on a surface of the metal particles, wherein
a viscosity of contained components except the metal particles at the first temperature T1 is 0.57 Pa·s or less, and the first temperature T1 and the third temperature T3 satisfy T1−T3<50° C.

5. The bonding material according to claim 4, wherein the metal particles contain a Sn—Bi-based alloy as a major component.

6. The bonding material according to claim 4, wherein the metal particles contain a Sn—Pb-based alloy as a major component.

7. The bonding material according to claim 4, wherein a content of the metal particles is 50 vol % or less in volume ratio.

8. The bonding material according to any claim 4, wherein a content of the metal particles is 10 vol % or more in volume ratio.

9. The bonding material according to claim 4, wherein a content of the metal particles is 15 vol % or more in volume ratio.

10. The bonding material according to claim 4, wherein a volume content of the activating agent is 0.1 to 16 vol % relative to a whole of the bonding material.

11. A method for producing an electronic device having a plurality of electronic components each having two or more electrodes, wherein one electronic component and another electronic component among the plurality of electronic components are electrically connected, the method comprising:
applying the bonding material according to claim 4 onto the electrodes of the one electronic component and thereafter disposing the electrodes of the other electronic component onto the bonding material;
performing a heating treatment to melt the metal particles contained in the bonding material and to activate the activating agent contained in the bonding material to remove the oxide layer formed on the surface of the metal particles so as to bond the electrodes of the one electronic component and the electrodes of the other electronic component via the melted metal to form two or more electrode bonding parts that are electrically insulated from each other, and to fluidize the thermosetting resin contained in the bonding material so as to fill a gap between the electrode bonding parts with the thermosetting resin.

12. The method for producing an electronic device according to claim 11, wherein the metal particles contain a Sn—Bi-based alloy as a major component.

13. The method for producing an electronic device according to claim 11, wherein a content of the metal particles is 50 vol % or less in volume ratio.

14. The method for producing an electronic device according to any claim 11, wherein a content of the metal particles is 10 vol % or more and 50 vol % or less in volume ratio.

15. The method for producing an electronic device according to claim 11, wherein a content of the metal particles is 15 vol % or more and 50 vol % or less in volume ratio.

16. A method for producing an electronic device having a plurality of electronic components each of which has two or more electrodes, wherein one electronic component and another electronic component are electrically connected, the method comprising:
applying the bonding material according to claim 4 onto a surface including the electrodes of the one electronic component and thereafter disposing the other electronic component onto the bonding material, and
performing a heating treatment to melt the metal particles contained in the bonding material and to activate the activating agent contained in the bonding material to remove the oxide layer formed on the surface of the metal particles, so as to let the melted metal particles move to a site between the electrodes of the one electronic component and the electrodes of the other electronic component so as to form two or more electrode bonding parts that are electrically insulated from each other and to fill between the electrode bonding parts with the thermosetting resin contained in the bonding material.

17. The method for producing an electronic device according to claim 16, wherein the metal particles contain a Sn—Bi-based alloy as a major component.

18. The method for producing an electronic device according to claim 16, wherein a content of the metal particles is 50 vol % or less in volume ratio.

19. The method for producing an electronic device according to any claim 16, wherein a content of the metal particles is 10 vol % or more and 50 vol % or less in volume ratio.

20. The method for producing an electronic device according to claim 16, wherein a content of the metal particles is 15 vol % or more and 50 vol % or less in volume ratio.

* * * * *